US009190625B2

(12) United States Patent
Lin et al.

(10) Patent No.: US 9,190,625 B2
(45) Date of Patent: Nov. 17, 2015

(54) ORGANIC ELECTROLUMINESCENT DEVICE HAVING CONDUCTIVE LAYERS IN A CATHODE LAYER AND AN ELECTRON TRANSPORTING LAYER HAVING A METAL COMPLEX

(71) Applicant: Au Optronics Corporation, Hsinchu (TW)

(72) Inventors: Kuan-Heng Lin, Kaohsiung (TW); Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/257,007

(22) Filed: Apr. 21, 2014

(65) Prior Publication Data

US 2015/0179969 A1    Jun. 25, 2015

(30) Foreign Application Priority Data

Dec. 20, 2013 (TW) .............................. 102147595 A

(51) Int. Cl.
*H01L 51/50* (2006.01)
*H01L 51/52* (2006.01)
*H01L 51/00* (2006.01)

(52) U.S. Cl.
CPC .......... *H01L 51/5092* (2013.01); *H01L 51/506* (2013.01); *H01L 51/5012* (2013.01); *H01L 51/5068* (2013.01); *H01L 51/5215* (2013.01); *H01L 51/5218* (2013.01); *H01L 51/5221* (2013.01); *H01L 51/0077* (2013.01)

(58) Field of Classification Search
None
See application file for complete search history.

(56) References Cited

U.S. PATENT DOCUMENTS

| 2008/0061333 | A1* | 3/2008 | Hidaka .......................... 257/295 |
| 2009/0162644 | A1 | 6/2009 | Ricks et al. |
| 2010/0289009 | A1 | 11/2010 | Ganeshamurugan et al. |
| 2012/0007068 | A1* | 1/2012 | Smith et al. ...................... 257/40 |
| 2012/0241726 | A1* | 9/2012 | Kijima ............................ 257/40 |
| 2012/0280214 | A1 | 11/2012 | Makino et al. |
| 2013/0026456 | A1* | 1/2013 | Hwang et al. .................... 257/40 |
| 2013/0048956 | A1* | 2/2013 | Balaganesan et al. ........... 257/40 |

FOREIGN PATENT DOCUMENTS

| CN | 102394275 | 3/2012 |
| CN | 102820433 | 12/2012 |
| TW | 427098 | 3/2001 |
| TW | 200932043 | 7/2009 |
| TW | 201041440 | 11/2010 |
| TW | 201248960 | 12/2012 |

* cited by examiner

*Primary Examiner* — Michael Jung
(74) *Attorney, Agent, or Firm* — Jianq Chyun IP Office

(57) ABSTRACT

An organic electroluminescent device including an anode layer, an organic functional layer and a cathode layer is provided. The organic functional layer is disposed between the anode layer and the cathode layer. The cathode layer includes a first conductive layer and a second conductive layer. The first conductive layer is disposed between the organic functional layer and the second conductive layer, and work function of the first conductive layer is higher than work function of the second conductive layer.

16 Claims, 6 Drawing Sheets

ORGANIC ELECTROLUMINESCENT DEVICE HAVING CONDUCTIVE LAYERS IN A CATHODE LAYER AND AN ELECTRON TRANSPORTING LAYER HAVING A METAL COMPLEX

CROSS-REFERENCE TO RELATED APPLICATION

This application claims the priority benefit of Taiwan application serial no. 102147595, filed on Dec. 20, 2013. The entirety of the above-mentioned patent application is hereby incorporated by reference herein and made a part of this specification.

FIELD OF THE INVENTION

The invention relates to a luminescence device; more particularly, the invention relates to an organic electroluminescent device.

DESCRIPTION OF RELATED ART

An organic electroluminescent device is a semiconductor device capable of converting electrical energy into optical energy and having high conversion efficiency. Organic electroluminescent devices are wildly used as luminous elements in indication lamps, display panels and optical pick-ups. The organic electroluminescent devices have advantages such as no viewing-angle dependence, simple processing, low production costs, high response speed, wide operation temperature ranges and full color. Therefore, the organic electroluminescent devices meet the demands for modern multi-media displays, and may become the mainstream of the panel display in the next generation.

In general, the organic electroluminescent device includes an anode, an organic electroluminescent layer and a cathode. The luminance mechanism of the organic electroluminescent device works by injecting holes and electrons into the organic electroluminescent layer from the anode and the cathode, respectively. When encountered in the organic electroluminescent layer, the electrons and the holes may recombine to generate photons, and the phenomenon of light emission is generated. In order for the electrons to be successfully injected from electrodes into the organic electroluminescent layer at lower driving voltage, an N-type doped electron transporting layer may further be disposed between the cathode and a light emitting layer, wherein an N-type dopant is usually doped in a material layer during a co-evaporation process. Accordingly, carrier concentration of the electron transporting layer is increased to generate tunneling effects, which facilitates injection of the electrons into the organic electroluminescent layer.

However, if alkali or alkaline earth metal salt having the high activation are used as a material (e.g. N-type dopant) of an electron injection layer, the material (i.e. alkali or alkaline earth metal salt) is not air-stable and may have a shorter lifetime. On the other hand, when an air-stable electron injection material and commonly used cathode material (e.g. silver, magnesium or other alkaline earth elements) are utilized, electrons may not be injected into an organic electroluminescent layer efficiently. Thus, when compared with alkali or alkaline earth metal salt having the high activation, the air-stable electron injection material requires higher driving voltage for driving the organic electroluminescent device, thereby luminance efficiency of the organic electroluminescent device is difficult to be enhanced.

Hence, a consideration of a lifetime and luminance efficiency of the organic electroluminescent device has become one of essential topics for researchers and developers in the field.

SUMMARY OF THE INVENTION

The invention provides an organic electroluminescent device which has favorable luminance efficiency and lifetime.

The organic electroluminescent device of the invention includes an anode layer, an organic functional layer and a cathode layer. The organic functional layer is disposed between the anode layer and the cathode layer. The cathode layer includes a first conductive layer and a second conductive layer. The first conductive layer is disposed between the organic functional layer and the second conductive layer, and work function of the first conductive layer is higher than work function of the second conductive layer.

In view of the above, in the invention, work function of the first conductive layer is set to be higher than work function of the second conductive layer by arranging the first conductive layer in between the organic functional layer and the second conductive layer, such that electrons are successfully injected into the organic electroluminescent layer. Consequently, driving voltage of the organic electroluminescent device can be effectively reduced, and luminance efficiency of the organic electroluminescent device is significantly improved.

To make the aforesaid features and advantages of the invention more comprehensible, several embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
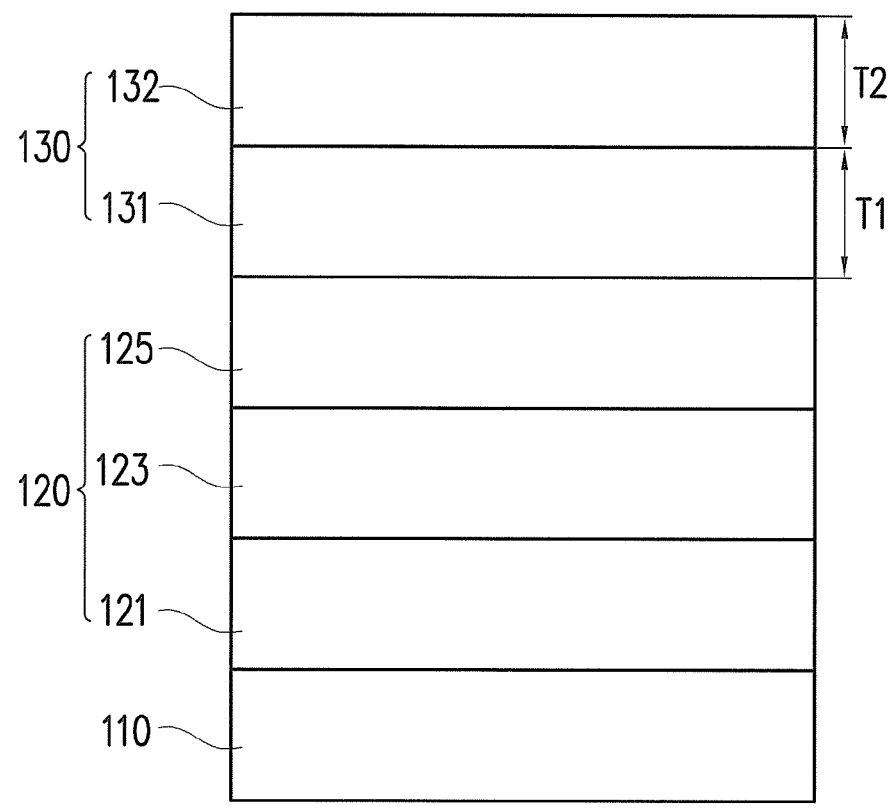
FIG. 1 is a schematic cross-sectional view illustrating an organic electroluminescent device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view illustrating an organic electroluminescent device according to an embodiment of the invention. With reference to FIG. 1, an organic electroluminescent device 100 of the present embodiment includes an anode layer 110, an organic functional layer 120 and a cathode layer 130. For example, the anode layer 110 includes a reflective electrode or a transparent electrode, or stacking layers of a combination thereof. A material of the reflective electrode is, for example, copper (Cu), aluminum (Al), silver (Ag), gold (Au), titanium (Ti), molybdenum (Mo), tungsten (W), chromium (Cr), and an alloy thereof or a stacking layer thereof. The transparent electrode is, for example, a metal oxide layer including indium tin oxide (ITO), indium zinc oxide (IZO), aluminum tin oxide (ATO), aluminum zinc oxide (AZO), indium germanium zinc oxide (IGZO), or any other suitable metal oxide. In other applicable embodiments, the transparent electrode may also be a stacking layer of at least two of the above (metal oxides), or a thin metal layer having high transmittance or thin metal stacking layers.

On the other hand, the organic functional layer 120 of the present embodiment is disposed between the anode layer 110 and the cathode layer 130. More specifically, the organic functional layer 120 includes a hole transporting layer 121, an organic electroluminescent layer 123 and an electron transporting layer 125. For example, the organic electroluminescent layer 123 may be a white light luminescent material layer or a luminescent material layer capable of emitting other specific color lights (e.g., red light, green light, blue light, ultraviolet light, etc). In addition, the hole transporting layer 121 is disposed between the organic electroluminescent layer 123 and the anode layer 110. The electron transporting layer 125 is disposed between the organic electroluminescent layer 123 and the cathode layer 130. For example, the electron transporting layer 125 is an N-type doped electron transporting layer. In more detail, the electron transporting layer 125 of the present embodiment is doped with a metal complex compound, and the metal complex compound has at least one of the following chemical structure formulae as shown in Formula 1 to Formula 6.

For example, a material of the metal complex compound includes 8-hydroquinolatolithium (Liq) having the following formula:

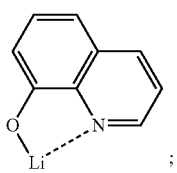

(Formula 1)

alternatively, the material of the metal complex compound includes a metal salt containing [2-(2-pyridyl)phenolate (PP)], and a formula thereof is as shown below:

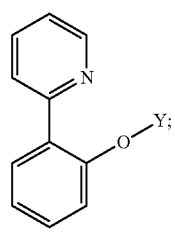

(Formula 2)

wherein Y may be lithium (Li), sodium (Na), potassium (K) or caesium (Cs); namely, the metal complex compound includes [lithium 2-(2-pyridyl)phenolate (LiPP)], [sodium 2-(-pyridyl)phenolate (NaPP)], [potassium 2-(2-pyridyl)phenolate (KPP)], [caesium 2-(2-pyridyl)phenolate (CsPP)];

alternatively, the material of the metal complex compound includes a metal salt containing [2-(20, 20 0-bipyridine-60-yl)phenolate (BPP), and a formula thereof is as shown below:

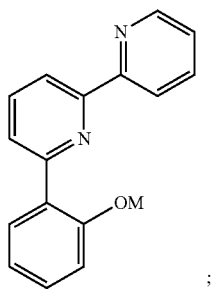

(Formula 3)

wherein M may be lithium (Li) or sodium (Na). Namely, the metal complex compound includes [lithium 2-(20, 20 0-bipyridine-60-yl)phenolate (LiBPP)] or [sodium 2-(20,20 0-bipyridine-60-yl)phenolate (NaBPP)];

alternatively, the material of the metal complex compound includes [lithium 2-(isoquinoline-10-yl)phenolate (LiIQP)], and a formula thereof is as shown below:

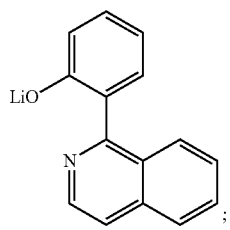

(Formula 4)

alternatively, the material of the metal complex compound includes {2-[2'-Hydroxyphenyl-5-(pyridyl-3-yl)]phenanthrolinato Lithium (LiPBPy)}, and a formula thereof is as shown below:

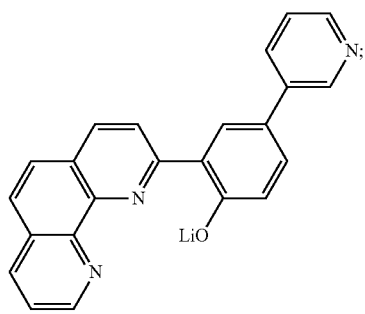

(Formula 5)

alternatively, the material of the metal complex compound includes [2-(2'-hydroxyphenyl)phenanthrolinato Lithium (LiPB)], and a formula thereof is as shown below:

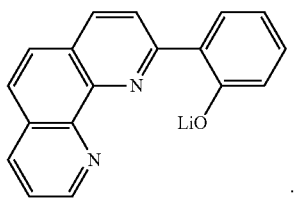

(Formula 6)

In light of the foregoing, all of the materials of the metal complex compound have properties such as thermal stability or non-deliquescence that is stable in a common environment. In other words, the electron transporting layer 125 of the present embodiment adopts an electron injection material is air-stable.

In the present embodiment, the cathode 130 includes a first conductive layer 131 and a second conductive layer 132, and the first conductive layer 131 is disposed between the organic functional layer 120 and the second conductive layer 132. In the present embodiment, work function of the first conductive layer 131 is higher than work function of the second conductive layer 132. In particular, work function of the first conductive layer 131 is W1, and work function of the second conductive layer 132 is W2, wherein 2 eV≤W2<4.0 eV, and 4 eV≤W1<5.7 eV. For example, a material of the first conductive layer 131 includes silver (Ag) or aluminum (Al), wherein work function of Ag is approximately 4.26 eV, while work function of Al is approximately 4.28 eV. In addition, a material of the second conductive layer 132 includes magnesium (Mg) or calcium (Ca), wherein work function of Mg is approximately 3.66 eV, while work function of Ca is approximately 2.87 eV.

Furthermore, the cathode layer 130 of the present embodiment is formed by stacking the first conductive layer 131 and the second conductive layer 132, and light absorptivity of the first conductive layer 131 is different from that of the second conductive layer 132. Therefore, a relation of a thickness ratio between the first conductive layer 131 and the second conductive layer 132 may also affect luminance efficiency and driving voltage at the same time. Further illustrations will be provided in the accompanying FIG. 2A to FIG. 2B.

Figure 2A:
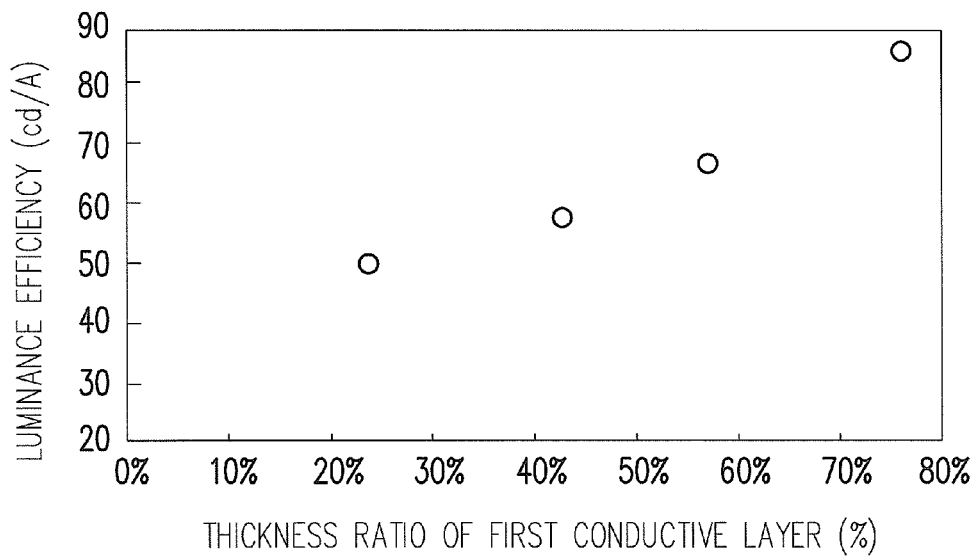
FIG. 2A is a graph illustrating luminance efficiency of the organic electroluminescent device of FIG. 1 versus a thickness ratio of the first conductive layer and the cathode layer.
Figure 2B:
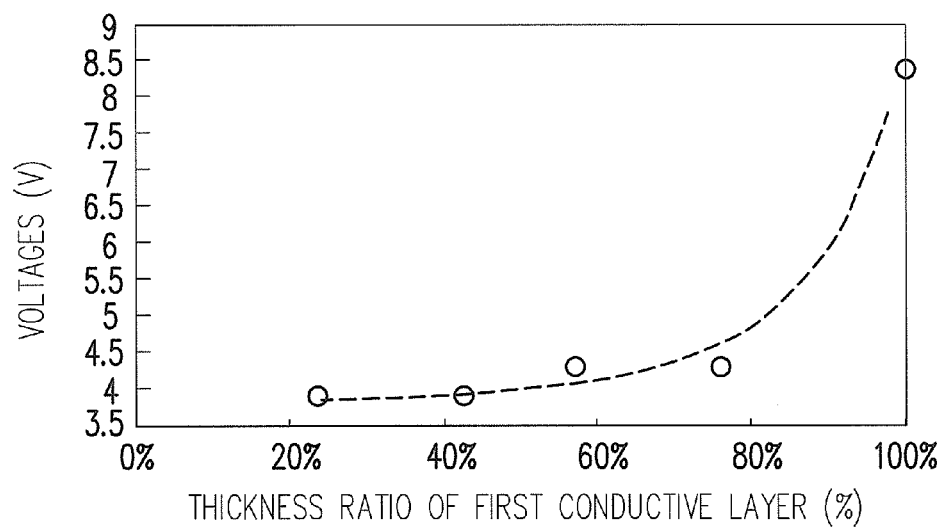
FIG. 2B is a graph illustrating voltages of the organic electroluminescent device of FIG. 1 versus a thickness ratio of the first conductive layer and the cathode layer.

FIG. 2A is a graph illustrating luminance efficiency of the organic electroluminescent device of FIG. 1 versus a thickness ratio of a first conductive layer in a cathode layer, and FIG. 2B is a graph illustrating voltages of the organic electroluminescent device of FIG. 1 versus a thickness ratio of a first conductive layer in a cathode layer. The first conductive layer 131 of the present embodiment is, for example, silver (Ag), but the invention is not limited herein. According to FIG. 2A, the luminance efficiency of the organic electroluminescent device 100 of the present embodiment increases when a thickness ratio of the first conductive layer 131 in the cathode layer 130 increases. However, on the other hand, according to FIG. 2B, when the thickness ratio of the first conductive layer 131 in the cathode layer 130 is higher than 80%, a trend of acquiring driving voltages may also be rapidly increased. Thus, in the present embodiment, in order to lower driving voltage of the organic electroluminescent device 100 and maintain relatively high luminance efficiency at the same time, the thickness ratio of the first conductive layer 131 of the organic electroluminescent device 100 in the cathode layer 130 is controlled in a range of 60% to 80%. Namely, in the present embodiment, when the first conductive layer 131 of the organic electroluminescent device 100 has a thickness of T1 and the second conductive layer 132 has a thickness of T2, [T1/(T1+T2)] ranges from 0.6 to 0.8.

As such, in the present embodiment, work function of the first conductive layer 131 is higher than work function of the second conductive layer 132 by arranging the first conductive layer 131 in between the organic functional layer 120 and the second conductive layer 132, such that electrons are successfully and efficiently injected into the organic electroluminescent layer 123. Consequently, the driving voltage of the organic electroluminescent device 100 may be effectively reduced, and the luminance efficiency of the organic electroluminescent device 100 is significantly improved. Furthermore, since the electron transporting layer 125 of the present embodiment adopts an air-stable electron injection material, the organic electroluminescent device 100 also has a long life time and is suitable for a mass production.

Figure 3A:
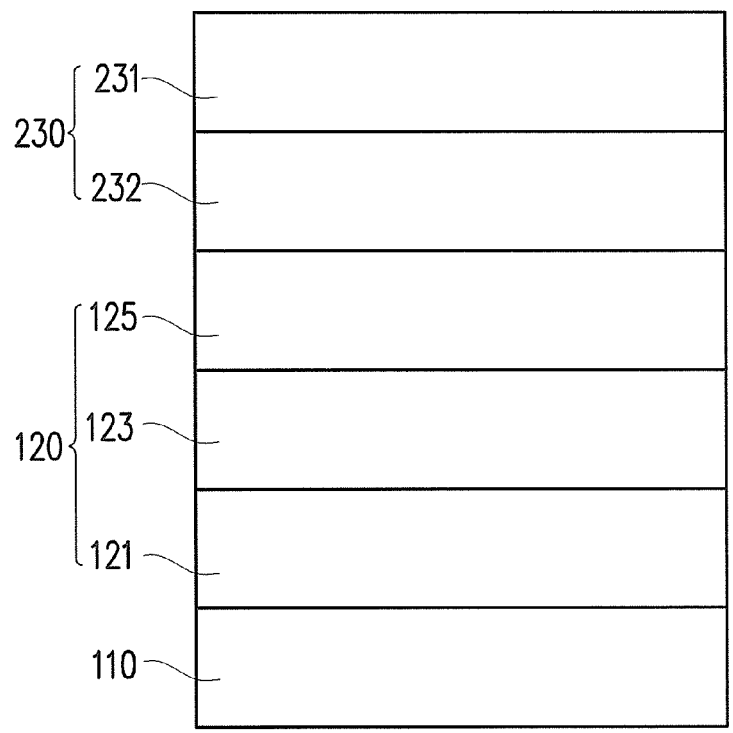
FIG. 3A and FIG. 3B are schematic cross-sectional views illustrating various organic electroluminescent devices according to Comparative Examples of the invention.
Figure 3B:
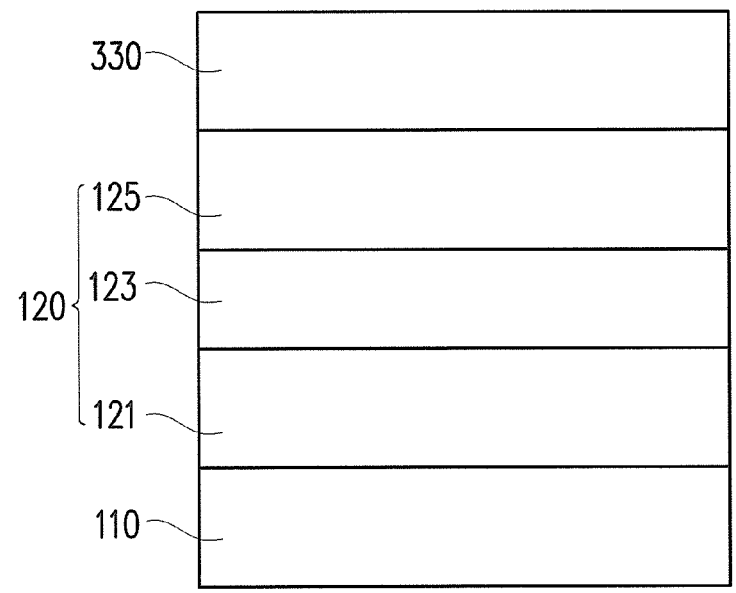
Figure 3C:
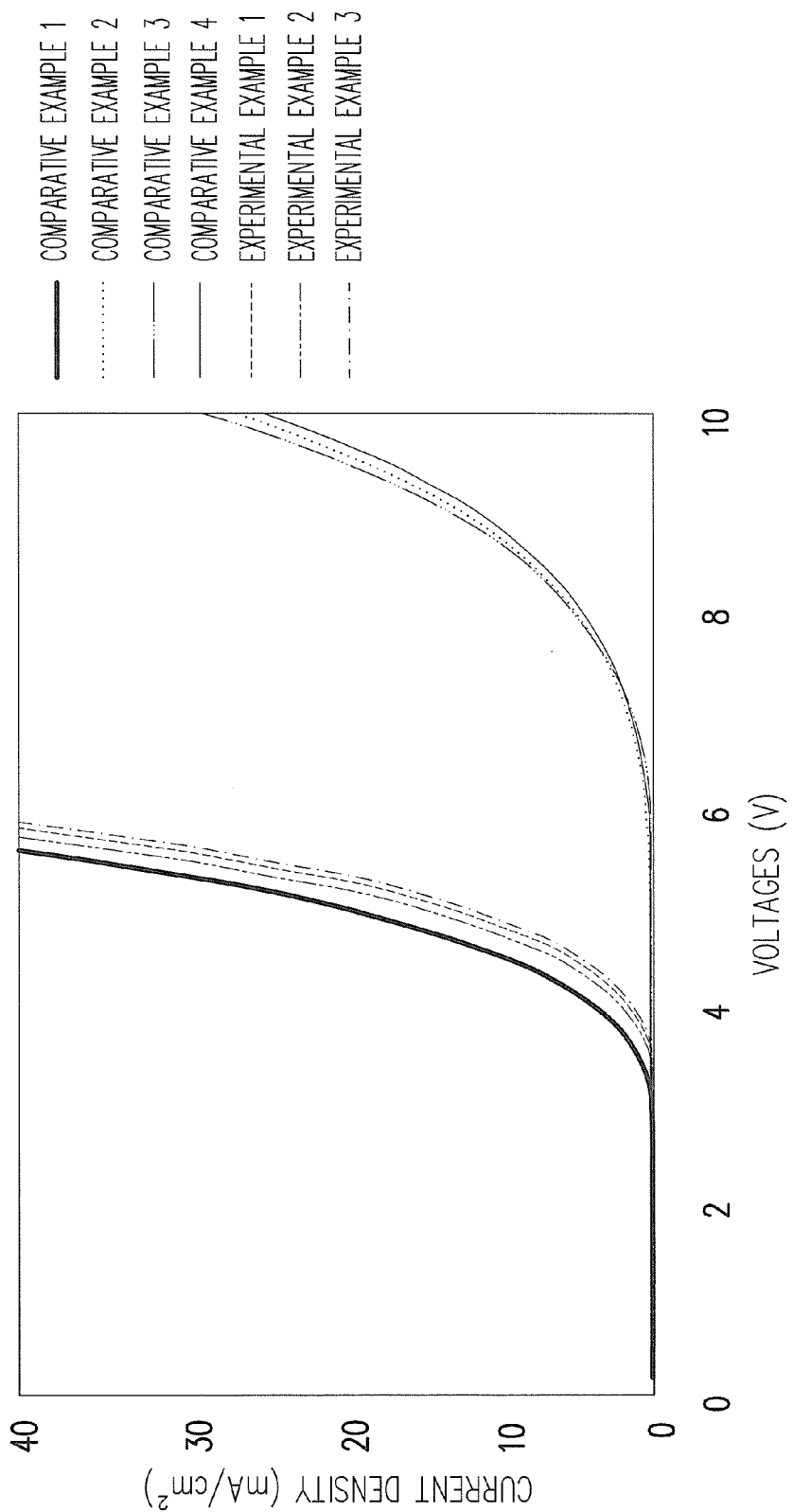
FIG. 3C is a graph illustrating current density versus voltages (I-V curve) in different Embodiments and different Comparative Examples.

Further illustrations will be provided in the accompanying FIG. 3A to FIG. 3C with the effects of the present embodiment.

FIG. 3A and FIG. 3B are schematic cross-sectional views illustrating different organic electroluminescent devices according to Comparative Examples of the invention. With reference to FIG. 3A and FIG. 3B, structures of organic electroluminescent devices 200 and 300 are similar to that of the organic electroluminescent device 100 of FIG. 1, and differences therebetween are described below. In a Comparative Example illustrated in FIG. 3A, a second conductive layer 232 of a cathode layer 230 of the organic electroluminescent device 200 is disposed between the organic functional layer 120 and a first conductive layer 231. In a Comparative Example illustrated in FIG. 3B, a cathode layer 330 of the organic electroluminescent device 300 is a single-layered conductive structure, wherein a material of the cathode layer 330 includes silver (Ag) or aluminum (Al). In other words, in the Comparative Example illustrated in FIG. 3B, the cathode layer 330 has a higher work function.

FIG. 3C is a graph illustrating current density versus voltages in Experimental examples and different Comparative Examples. In the graph, the organic electroluminescent device 100 of Experimental example 1 to Experimental example 3 has a structure as shown in FIG. 1, and the metal complex compound of the electron transporting layer 125 is 8-hydroquinolatolithium (Liq) mentioned above. In addition, materials of the first conductive layer 131 and the second conductive layer 132 in Experimental example 1 are silver (Ag) and calcium (Ca), respectively. Materials of the first conductive layer 131 and the second conductive layer 132 in Experimental example 2 are silver (Ag) and magnesium (Mg), respectively, and materials of the first conductive layer 131 and the second conductive layer 132 in Experimental example 3 are aluminum (Al) and magnesium (Mg), respectively. The first conductive layer 131 and the second conductive layer 132 have thicknesses of 16 nm and 5 nm, respectively. Furthermore, a dosage of the metal complex compound of the electron transporting layer 125 is 40%.

On the other hand, the organic electroluminescent device 200 of Comparative Example 1 to Comparative Example 2 has a structure as shown in FIG. 3A, and the metal complex compound of the electron transporting layer 125 in Comparative Example 1 is alkali or alkaline earth metal salt having high activation, such as cesium fluoride (CsF), while the metal complex compound of the electron transporting layer 125 in Comparative Example 2 is 8-hydroquinolatolithium (Liq) mentioned above. In addition, the materials of the first conductive layer 231 in Comparative Example 1 to Comparative Example 2 are silver (Ag), while the materials of the second conductive layer 232 are magnesium (Mg); and the first conductive layer 231 and the second conductive layer 232 have thicknesses of 16 nm and 5 nm, respectively. Furthermore, the dosage of the metal complex compound of the electron transporting layer 125 is 40%.

Moreover, the organic electroluminescent device 300 of Comparative Example 3 to Comparative Example 4 has a structure as shown in FIG. 3B, and the metal complex compound of the electron transporting layer 125 is 8-hydroquinolatolithium (Liq) mentioned above. Additionally, a material of the cathode layer 330 in Comparative Example 3 is silver (Ag), while a material of the cathode layer 330 in Comparative Example 4 is aluminum (Al). The cathode layer has a thickness of 21 nm. Furthermore, the dosage of the metal complex compound of the electron transporting layer 125 is 40%.

According to FIG. 3C, the organic electroluminescent device 100 in Experimental example 1 to Experimental example 3 having the structure as shown in FIG. 1 can be driven by relatively lower driving voltage when compared with the organic electroluminescent devices 200 and 300 in Comparative Example 2 to Comparatively Example 4. Besides, the organic electroluminescent device 200 in Comparative Example 1 doped with alkali or alkaline earth metal salt having high activation (e.g., CsF) may also be driven by low driving voltage.

However, in the Comparative Example 1, since CsF is a kind of alkali or alkaline earth metal salt having high activation and is not air-stable, as compared with the organic electroluminescent devices 100 having the structure as shown in FIG. 1 in Experimental example 1 to Experimental example 3, the organic electroluminescent device 200 in Comparative Example 1 have a relatively shorter life time. Further illustrations will be provided in the accompanying Table 1.

Table 1 is a comparison table illustrating related data when Comparative Example 1 and Experimental example 2 are applied on a blue light device and a green light device.

TABLE 1

|  | Blue Light Device | | | Green Light Device | | |
| --- | --- | --- | --- | --- | --- | --- |
|  | Driving Voltage (V) | Luminance Efficiency (cd/A) | LT95% (hrs) | Driving Voltage (V) | Luminance Efficiency (cd/A) | LT95% (hrs) |
| Comparative Example 1 | 4.2 | 4.4 | 32 | 4.0 | 76.0 | 210 |
| Experimental example 2 | 4.5 | 5.5 | 120 | 4.3 | 91.0 | 325 |

In Table 1, brightness provided by the blue light device is 1000 nits, and brightness provided by the green light device is 4000 nits. Values of the driving voltages represent required voltages when the organic electroluminescent devices 100 and 200 are driven under current density of 10 mA/cm$^2$, respectively. Values in LT95% column represent required hours for brightness to be reduced at 5% under normal working conditions. According to Table 1, in a situation where a driving voltages value of the organic electroluminescent device 200 in Comparative Example 1 is similar to that of the organic electroluminescent device 100 in Experimental example 2, the organic electroluminescent device 100 in Experimental example 2 has better luminance efficiency and a longer life time.

Figure 4:
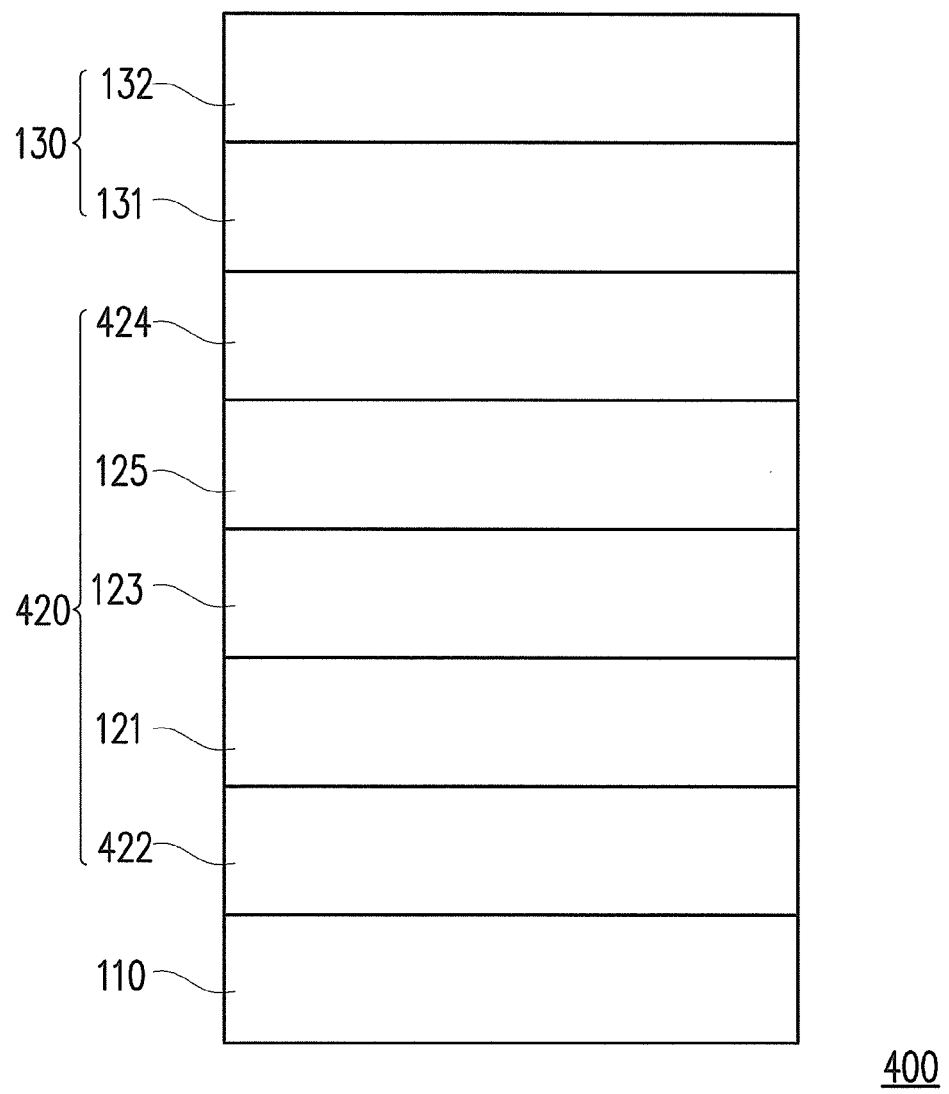
FIG. 4 is a schematic cross-sectional view illustrating an organic electroluminescent device according to another embodiment of the invention.

FIG. 4 is a schematic cross-sectional view illustrating an organic electroluminescent device according to another embodiment of the invention. With reference to FIG. 4, an organic electroluminescent device 400 of the present embodiment is similar to the organic electroluminescent device 100 of FIG. 1 except that: an organic functional layer 420 of the organic electroluminescent device 400 of the present embodiment further includes an electron injection layer 424 and an hole injection layer 422, wherein the electron injection layer 424 is disposed between the electron transporting layer 125 and the cathode layer 130, and the hole injection layer 422 is disposed between the hole transporting layer 121 and the anode layer 110. For example, the electron injection layer 424 of the present embodiment is a metal complex layer. However, the invention is not limited herein. In other embodiments, the electron injection layer 424 may also be doped with a metal complex compound.

Figure 5:
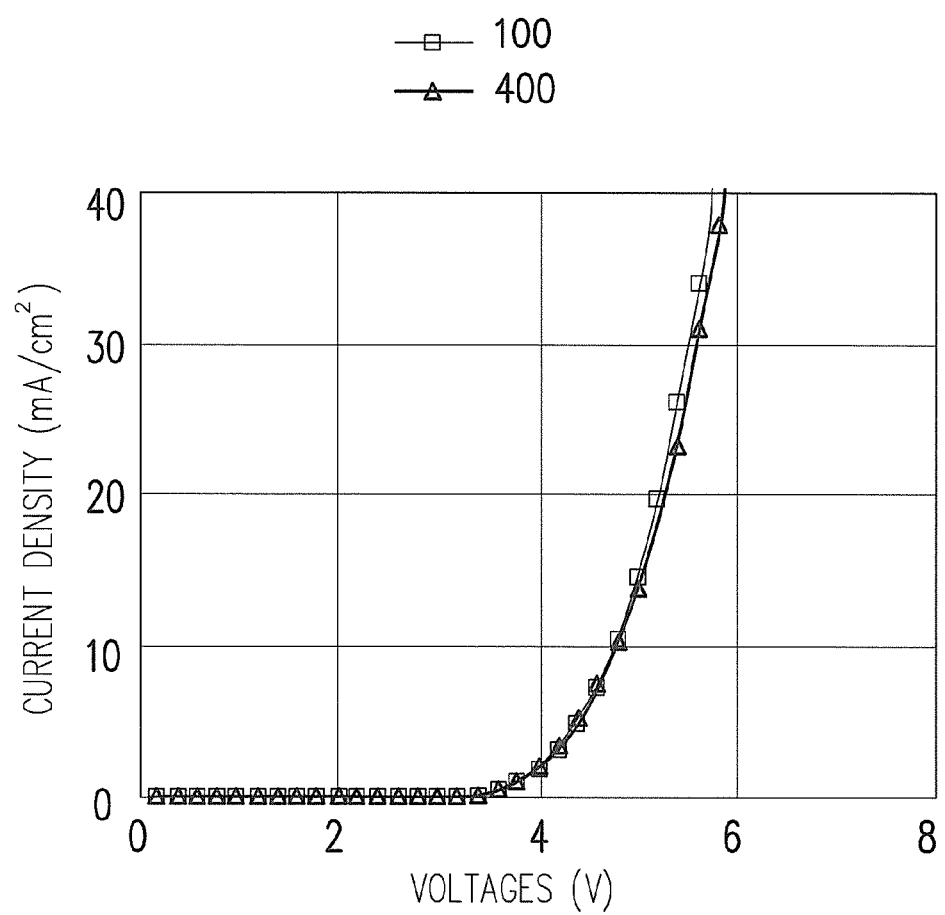
FIG. 5 is a graph illustrating current density versus voltages of the organic electroluminescent devices of FIG. 1 and FIG. 4.

FIG. 5 is a graph illustrating current density versus voltages of the organic electroluminescent devices of FIG. 1 and FIG. 4. According to FIG. 5, the organic electroluminescent devices 100 and 400 of FIG. 1 and FIG. 4 have similar curves of current density versus voltages. Namely, under the same condition, the organic electroluminescent device 400 may achieve optical or electrical properties similar to those achieved by the organic electroluminescent device 100. Thus, the organic electroluminescent device 400 also has advantages similar to those of the organic electroluminescent device 100, and a reiteration is omitted herein.

In view of the above, in the invention, work function of the first conductive layer is set to be higher than work function of the second conductive layer by arranging the first conductive layer in between the organic functional layer and the second conductive layer, such that electrons are successfully and efficiently injected into the organic electroluminescent layer. Consequently, the driving voltages of the organic electroluminescent device are effectively reduced, and the luminance efficiency of the organic electroluminescent device is advantageously improved. Furthermore, since the electron transporting layer of the present embodiment adopts the air-stable electron injection material, the organic electroluminescent device also has an excellent long life time and is suitable for a mass production.

Although the invention has been disclosed with reference to the aforesaid embodiments, they are not intended to limit the invention. It will be apparent to those skilled in the art that various modifications and variations can be made to the structure of the disclosed embodiments without departing from the scope or spirit of the invention. In view of the foregoing, it is intended that the disclosure cover modifications and variations of the specification provided they fall within the scope of the following claims and their equivalents.

What is claimed is:

1. An organic electroluminescent device, comprising:
   an anode layer;
   an organic functional layer, comprising an organic electroluminescent layer and an electron transporting layer, wherein the organic electroluminescent layer is disposed between the anode layer and the electron transporting layer; and
   a cathode layer, the organic functional layer being disposed between the anode layer and the cathode layer, and the cathode layer being consisting of:
   a first conductive layer, wherein the first conductive layer is a single layer made from a single material; and
   a second conductive layer, the first conductive layer being disposed between the electron transporting layer and the second conductive layer, wherein the first conductive layer is in physical contact with the electron transporting layer and the second conductive layer, the electron transporting layer is doped with a metal complex compound, and work function of the first conductive layer being higher than work function of the second conductive layer.

2. The organic electroluminescent device as claimed in claim 1, wherein the anode layer comprises a reflective electrode or a transparent electrode, or stack layers of a combination thereof.

3. The organic electroluminescent device as claimed in claim 1, wherein the organic functional layer further comprises a hole transporting layer disposed between the organic electroluminescent layer and the anode layer.

4. The organic electroluminescent device as claimed in claim 1, wherein the metal complex compound comprises a metal complex compound of lithium (Li), sodium (Na), potassium (K), or caesium (Cs).

5. The organic electroluminescent device as claimed in claim 1, wherein the metal complex compound comprises 8-hydroquinolatolithium (Liq), lithium 2-(2-pyridyl)phenolate (LiPP), sodium 2-(2-pyridyl)phenolate (NaPP), potassium 2-(2-pyridyl)phenolate (KPP), caesium 2-(2-pyridyl)phenolate (CsPP), lithium 2-(20, 20 0-bipyridine-60-yl)phenolate (LiBPP), sodium 2-(20, 20 0-bipyridine-60-yl)phenolate (NaBPP), lithium 2-(isoquinoline-10-yl)phenolate (LiIQP), 2-[2'-Hydroxyphenyl-5-(pyridyl-3-yl)]phenanthrolinato Lithium (LiPBPy) or 2-(2'-hydroxyphenyl)phenanthrolinato Lithium (LiPB).

6. The organic electroluminescent device as claimed in claim 1, wherein the electron transporting layer is an N-type doped electron transporting layer.

7. The organic electroluminescent device as claimed in claim 1, wherein work function of the first conductive layer is W1, work function of the second conductive layer is W2, and $2\ eV \leq W2 < 4.0\ eV$, and $4\ eV \leq W1 < 5.7\ eV$.

8. The organic electroluminescent device as claimed in claim 1, wherein a material of the first conductive layer comprises silver (Ag) or aluminum (Al), and a material of the second conductive layer comprises magnesium (Mg) or calcium (Ca).

9. The organic electroluminescent device as claimed in claim 1, wherein the first conductive layer has a thickness of T1, and the second conductive layer has a thickness of T2, and $[T1/(T1+T2)]$ ranges from 0.6 to 0.8.

10. An organic electroluminescent device, comprising:
an anode layer;
an organic functional layer; and
a cathode layer, the organic functional layer being disposed between the anode layer and the cathode layer, and the cathode layer being consisting of:
a first conductive layer, wherein the first conductive layer is a single layer made from a single material; and
a second conductive layer, the first conductive layer being disposed between the organic functional layer and the second conductive layer, wherein the first conductive layer is in contact with the organic functional layer and the second conductive layer, the organic functional layer comprises a layer doped with a metal complex compound, and work function of the first conductive layer being higher than work function of the second conductive layer.

11. The organic electroluminescent device as claimed in claim 10, wherein the layer doped with a metal complex compound is in contact with the first conductive layer.

12. The organic electroluminescent device as claimed in claim 10, wherein the metal complex compound comprises a metal complex compound of lithium (Li), sodium (Na), potassium (K), or caesium (Cs).

13. The organic electroluminescent device as claimed in claim 10, wherein the metal complex compound comprises 8-hydroquinolatolithium (Liq), lithium 2-(2-pyridyl)phenolate (LiPP), sodium 2-(2-pyridyl)phenolate (NaPP), potassium 2-(2-pyridyl)phenolate (KPP), caesium 2-(2-pyridyl)phenolate (CsPP), lithium 2-(20, 20 0-bipyridine-60-yl)phenolate (LiBPP), sodium 2-(20, 20 0-bipyridine-60-yl)phenolate (NaBPP), lithium 2-(isoquinoline-10-yl)phenolate (LiIQP), 2-[2'-Hydroxyphenyl-5-(pyridyl-3-yl)]phenanthrolinato Lithium (LiPBPy) or 2-(2'-hydroxyphenyl)phenanthrolinato Lithium (LiPB).

14. The organic electroluminescent device as claimed in claim 10, wherein work function of the first conductive layer is W1, work function of the second conductive layer is W2, and $2\ eV < W2 < 4.0\ eV$, and $4\ eV < W1 < 5.7\ eV$.

15. The organic electroluminescent device as claimed in claim 10, wherein a material of the first conductive layer comprises silver (Ag) or aluminum (Al), and a material of the second conductive layer comprises magnesium (Mg) or calcium (Ca).

16. The organic electroluminescent device as claimed in claim 10, wherein the first conductive layer has a thickness of T1, and the second conductive layer has a thickness of T2, and $[T1/(T1+T2)]$ ranges from 0.6 to 0.8.

* * * * *